US010725120B2

(12) United States Patent
Szumanski (10) Patent No.: US 10,725,120 B2
(45) Date of Patent: Jul. 28, 2020

(54) ISOLATED GROUNDING EFFECTIVENESS MONITOR (71) Applicant: Siemens Healthcare GmbH, Erlangen (DE)

(72) Inventor: Thomas Szumanski, McHenry, IL (US)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 16/275,879

(22) Filed: Feb. 14, 2019

(65) Prior Publication Data
US 2019/0302164 A1 Oct. 3, 2019

(30) Foreign Application Priority Data
Mar. 28, 2018 (EP) .................................. 18164703

(51) Int. Cl.
G01R 31/50 (2020.01)
G08B 21/18 (2006.01)
H03K 3/80 (2006.01)
H03K 17/96 (2006.01)
G01R 27/14 (2006.01)
G01R 27/02 (2006.01)

(52) U.S. Cl.
CPC ........... G01R 31/50 (2020.01); G01R 27/025 (2013.01); G01R 27/14 (2013.01); G08B 21/182 (2013.01); H03K 3/80 (2013.01); H03K 17/962 (2013.01); H03K 2217/9605 (2013.01)

(58) Field of Classification Search
CPC .................. A61B 18/1206; A61B 2017/1482

USPC ......................................................... 340/657
See application file for complete search history.

(56) References Cited

U.S. PATENT DOCUMENTS

| 4,200,104 A | 4/1980 | Harris |
| 5,101,160 A | 3/1992 | Barjonnet et al. |
| 5,616,091 A | 4/1997 | Warren |
| 5,632,280 A | 5/1997 | Leyde et al. |
| 9,680,528 B2 | 6/2017 | Shrestha |
| 2010/0311379 A1* | 12/2010 | Rofougaran ........... H01Q 15/23 455/307 |
| 2012/0146655 A1 | 6/2012 | Suchoff |
| 2012/0299599 A1 | 11/2012 | Naruse et al. |

(Continued)

FOREIGN PATENT DOCUMENTS

| DE | 10106200 C1 | 9/2002 |
| EP | 654673 A1 | 5/1995 |

(Continued)

OTHER PUBLICATIONS

Extended Search Report for Corresponding Application EP 18164703.3 dated Sep. 19, 2018.

*Primary Examiner* — Fabricio R Murillo Garcia (57) ABSTRACT

A system for monitoring electrical current leakage comprises a frequency injection circuit, one or more devices, and a microprocessor. The frequency injection circuit includes an electronic oscillator providing an electrical signal to a first side of an isolation barrier. The devices are located on a second side of the isolation barrier. The microprocessor samples the electrical signal and identifies deviations in the sampled electrical signal exceeding a predetermined threshold caused by the one or more devices. The microprocessor further generates one or more alert messages based on the identified deviations in the electrical signal.

13 Claims, 7 Drawing Sheets (56) References Cited

U.S. PATENT DOCUMENTS

| | | | |
|---|---|---|---|
| 2014/0097854 A1 | 4/2014 | Hermeling et al. | |
| 2015/0263673 A1 | 9/2015 | Biel et al. | |
| 2016/0334452 A1 | 11/2016 | Mensler et al. | |
| 2017/0086911 A1* | 3/2017 | Wiener | A61B 18/1445 |
| 2017/0097384 A1* | 4/2017 | Yamada | B60L 50/60 |
| 2017/0110869 A1 | 4/2017 | Bargues | |
| 2017/0146584 A1 | 5/2017 | Daw et al. | |
| 2017/0157416 A1* | 6/2017 | Medema | A61N 1/046 |
| 2018/0146528 A1* | 5/2018 | Tseng | H05B 45/50 |

FOREIGN PATENT DOCUMENTS

| | | |
|---|---|---|
| GB | 2146534 A | 4/1985 |
| WO | 2005006000 A1 | 1/2005 |

* cited by examiner

ISOLATED GROUNDING EFFECTIVENESS MONITOR

TECHNICAL FIELD

The present invention relates generally to an isolated grounding effectiveness monitor, along with methods, systems, and apparatuses related thereto. The disclosed technology may be applied to, for example, in the medical domain to reduce or eliminate the risk of electrical shock in multi-device patient testing systems.

BACKGROUND

Patient monitoring devices, such as those included in hemodynamic systems, include various electrical components that facilitate the collection of measurement data from a patient. In order to protect the patient from electrical shock, any parts that could come in contact with the patient are electrically or mechanically isolated from the mains voltage of the device. Electrical isolation is typically achieved by creating a floating ground that is not at the same reference potential as the mains voltage. As would be understood in the art, the term "floating ground" refers to a ground that is not electrically connected to the earth. In the context of a patient monitoring device, the floating ground blocks potential leakage from flowing to the patient.

Failure of the isolation barrier provided by a floating ground can result in electrical shock to the patient or partial failure of this barrier can result in compromised signal quality. Thus, prior to implementation, manufacturers of medical devices typically test every device manufactured for electrical leakage currents using specialized leakage test equipment. This equipment applies a mains potential on the patient applied part and looks for a breakdown of the isolation barrier. This testing process is expensive, time consuming, necessitates specialized equipment, and requires a trained operator to execute the test procedure. Moreover, it is not uncommon for multiple patient connections to be connected to the same floating ground. This can lead to uncertainty of the parasitic capacitance to earth ground. When two different manufacturers connect equipment together, they are only tested individually rather than together.

SUMMARY

Embodiments of the present invention address and overcome one or more of the above shortcomings and drawbacks, by providing methods, systems, and apparatuses related to an isolated grounding effectiveness monitor.

According to some embodiments, a system for monitoring electrical current leakage comprises a frequency injection circuit, one or more devices, and a microprocessor. The frequency injection circuit includes an electronic oscillator providing an electrical signal to a first side of an isolation barrier. This electronic oscillator may be, for example, a sine wave oscillator or an oscillator producing a pulsating direct current signal. The devices are located on a second side of the isolation barrier. The microprocessor samples the electrical signal and identifies deviations in the sampled electrical signal exceeding a predetermined threshold caused by the one or more devices. The microprocessor further generates one or more alert messages based on the identified deviations in the electrical signal.

Various enhancements, refinements, and other modifications may be made to the aforementioned system in different embodiments of the present invention. For example, in some embodiments, microprocessor is connected to the frequency injection circuit on the first side of the isolation barrier. In other embodiments, the microprocessor is connected to at least one of the devices on the second side of the isolation barrier. The devices in the aforementioned system may include a capacitive sensor comprising a touch plate and the electrical signal is changed when a grounded person touches the touch plate.

In some embodiments of the aforementioned system, the system further includes a server computer configured to transmit the one or more alert messages to one or more users over a computer network. Additionally, the microprocessor may be further configured to disable mains electricity powering the one or more devices.

According to other embodiments, a method for monitoring electrical current leakage includes continuously sampling, by a microprocessor, an electrical signal transmitted across an isolation barrier to a plurality of devices. In some embodiments, the electrical signal is sampled on a side of the isolation barrier that comprises an electrical oscillator generating the electrical signal. In other embodiments, the electrical signal is sampled on a side of the isolation barrier that comprises the plurality of devices. The microprocessor identifies deviations in the sampled electrical signal exceeding a predetermined threshold caused by the plurality of devices; and executes one or more remedial actions based on the identified deviations in the electrical signal. These remedial actions may include, for example, generation of an alert message describing the deviations in the sampled electrical signal. This alert message may be transmitted to users via email and/or presented on a display. Alternatively (or additionally), the remedial actions may include disabling mains electricity powering the plurality of devices.

According to other embodiments, a method for monitoring electrical current leakage includes continuously sampling, by a microprocessor, an electrical signal transmitted across an isolation barrier to a capacitive sensor. The microprocessor identifies deviations in the sampled electrical signal exceeding a predetermined threshold caused by activation of the capacitive sensor. The microprocessor may then execute one or more remedial actions based on the identified deviations in the electrical signal.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there are shown in the drawings embodiments that are presently preferred, it being understood, however, that the invention is not limited to the specific instrumentalities disclosed. Included in the drawings are the following Figures.

DETAILED DESCRIPTION

The following disclosure describes the present invention according to several embodiments directed at methods, systems, and apparatuses associated with an isolated grounding effectiveness monitor. The techniques described herein are based on the insight that, current testing is effectively stressing the parasitic capacitance to earth ground across the patient isolation barrier. As described in further detail below, this same parasitic capacitance can be monitored in-vivo using a capacitive monitoring circuit at a much lower, and safer, voltage. Briefly, a custom charge injection circuit on one side of the isolation barrier passes a sense signal through the isolation barrier's parasitic capacitance at one or more frequencies of interest. The other side of the isolation barrier monitors the sense signal for threshold detection, changes to the barrier, or the presence of dangerous circumstances. If the isolation barrier's capacitance exceeded a calculated threshold, the sense circuit takes one or more appropriate actions to protect the patient and/or warn the operator.

Figure 1:
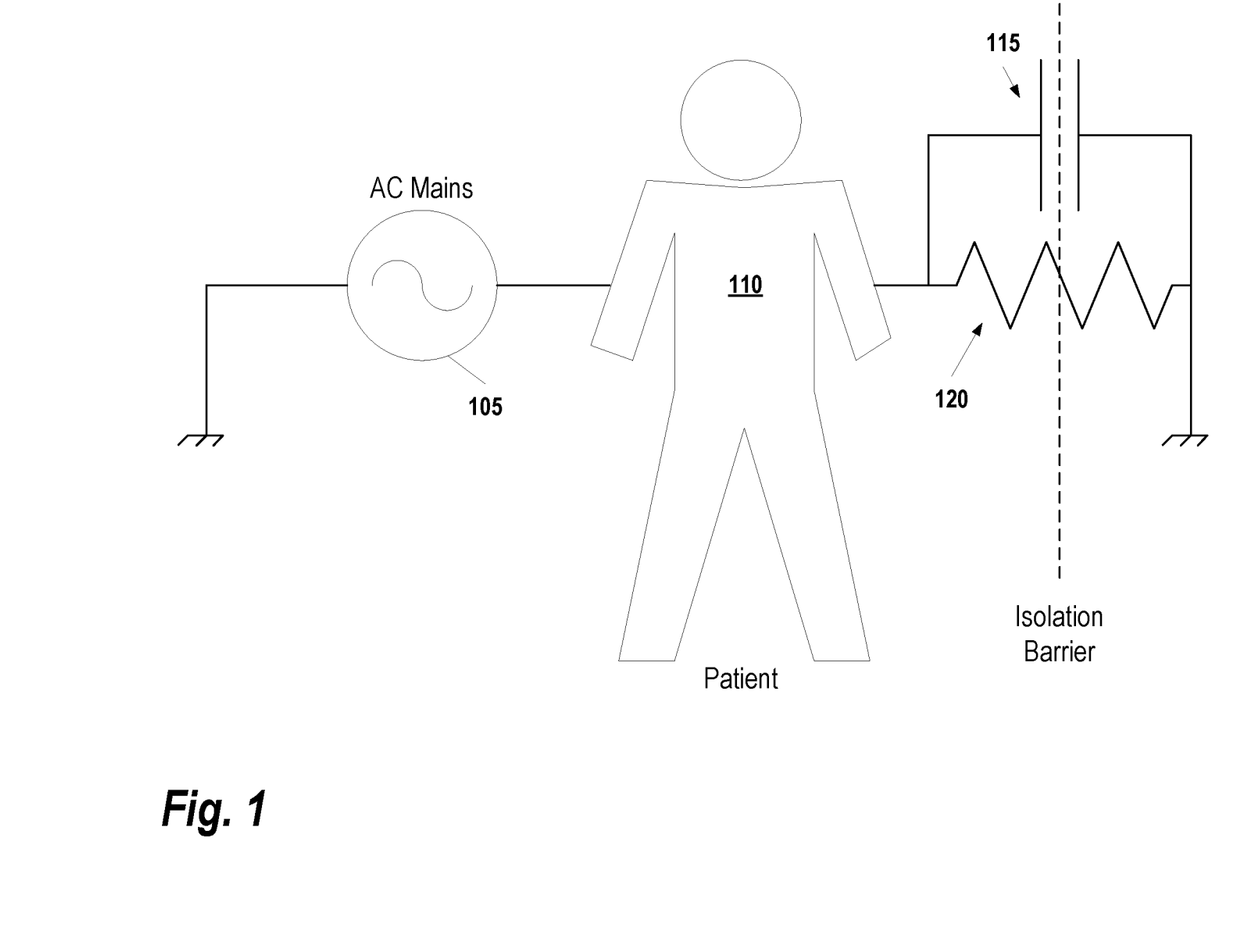
FIG. 1 illustrates an example of how electrical leakage can occur.

FIG. 1 outlines the general problem that the techniques seek to address. Patient safety is provided by heavy resistance between mains and ground. However, the capacitance between the Patient 110 and ground is equally as important. The current through the Patient 110 is proportional to the resistor-capacitor circuit (formed by Resistor 120 and Capacitor 115), as well as the frequency of the voltage source (i.e., AC Mains 105). The current density and specific pathway causes injury to the patient.

As is well understood in the art, for an alternating current (AC) circuit, the current across the capacitor may be determined by the following equations:

$$X_c = \frac{1}{2\pi f C}$$

$$I_{RMS} = \frac{V_{RMS}}{X_C}$$

where $X_C$ is the capacitive reactance, f is the frequency, C is the capacitance, $V_{RMS}$ is the root-mean square (RMS) voltage, and $I_{RMS}$ is the RMS current. Using these equations, one can determine how much current is going through a capacitor to give frequency at 50 Hz and 60 Hz (the values typically used for medical devices). Thus, one can determine what the capacitance needs to be to meet certain current, frequency, and voltage requirements. If one can monitor the capacitance actively, this would eliminate the need for pre-deployment and post-deployment testing by technicians. Moreover, the capacitance may be measured as people and equipment are connected to the medical device being monitored. In this way, actively testing capacitance offers additional benefits not present in current testing procedures. For example, there are many pieces of equipment attached to an individual during patient monitoring. Each piece of equipment can be made by different manufacturers. Each manufacturer tests their own equipment; however, the interconnections between equipment from different manufactures go untested. However, by actively testing whether the isolation barrier's capacitance exceeded a calculated threshold, the overall system can be robust enough to detect faults even as various devices are connected and disconnected, or used in various combinations with one another.

Figure 2:
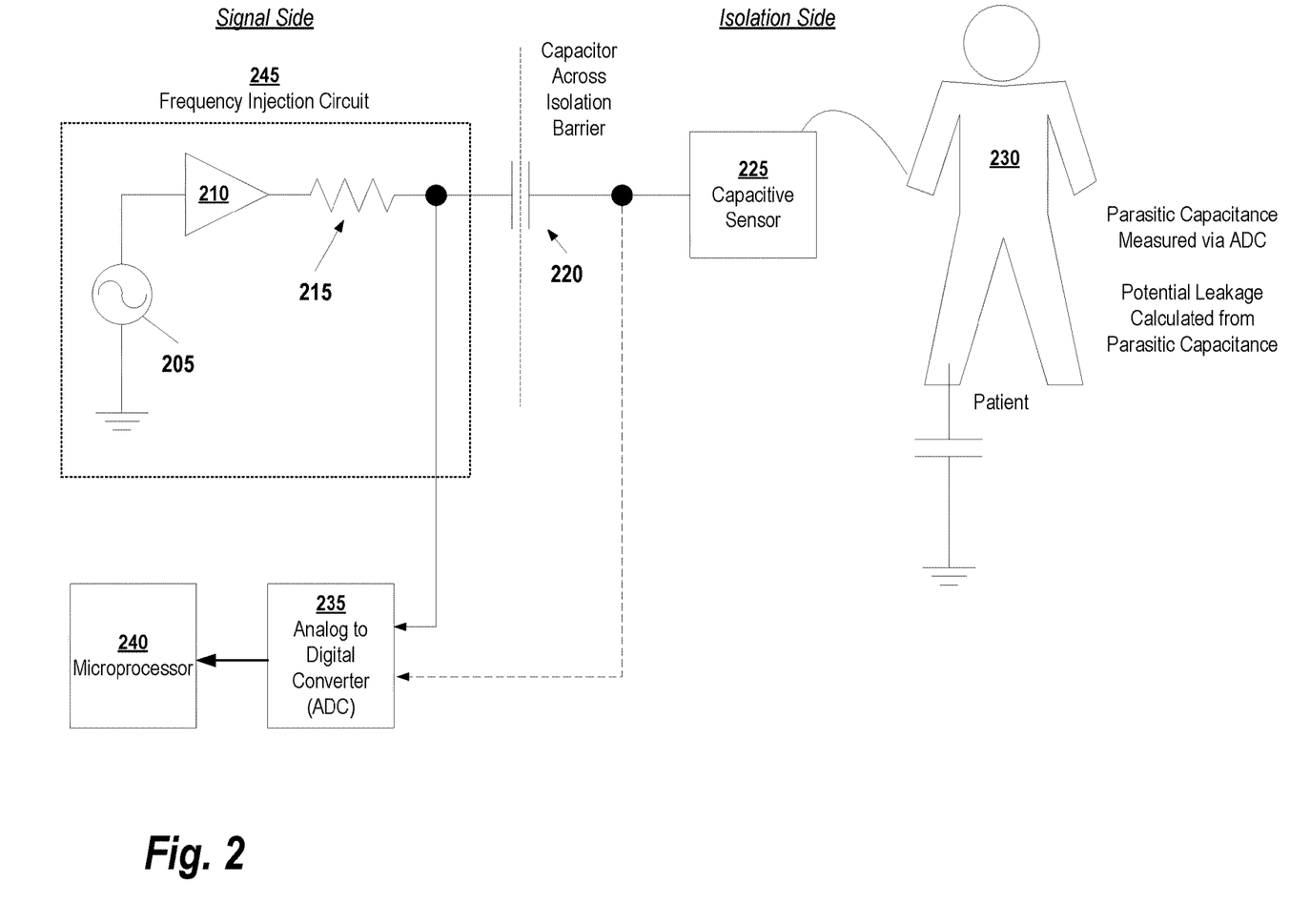
FIG. 2 provides an overview of a method of monitoring a group of devices for electrical leakage currents using parasitic capacitance, according to some embodiments of the present invention.

FIG. 2 provides an overview of a method of monitoring a group of devices for electrical leakage currents using parasitic capacitance, according to some embodiments of the present invention. This example is divided by a Capacitor 220 across the patient isolation barrier. On the left side of the Capacitor 220, referred to herein as the "Signal Side," the signal is generated by Frequency Injection Circuit 245. The right side of the Capacitor 220 in FIG. 2, in which the Patient 230 is located, is referred to as the "Isolated Side."

Frequency Injection Circuit 245 comprises an Electronic Oscillator 205 that provides a source of repetitive electrical signals at a particular amplitude. The source voltage provided by the Electronic Oscillator 205 could be, for example, either an AC frequency monitor for peak-to-peak voltage or a pulsed voltage in which the rise and fall times are monitored. For example, in one embodiment, the Electronic Oscillator 205 is a sine wave oscillator may produce a sine wave at a certain frequency (e.g., 1 MHz or 10 MHz). The exact frequency can be selected on a design by design basis for maximum sensitivity. Engineering studies can be performed in order to select the optimum frequency. In other embodiments, the Electronic Oscillator 205 produces a pulsating direct current signal. The signal generated by the Electronic Oscillator 205 passes through a Buffer 210 and Resistor 215 before being used as an input to the Capacitor 220 across the patient isolation barrier. In the example of FIG. 2, Capacitor 220 is the parasitic capacitance across the patient isolation barrier. Alternatively, in other embodiments, the Capacitor 220 may be a physical capacitor that is purposely inserted into the patient isolation barrier. Using the Capacitor 220, AC is coupled with the signal and DC is blocked such that only the carrier wave enters the other side of the isolation barrier.

Figure 3A:
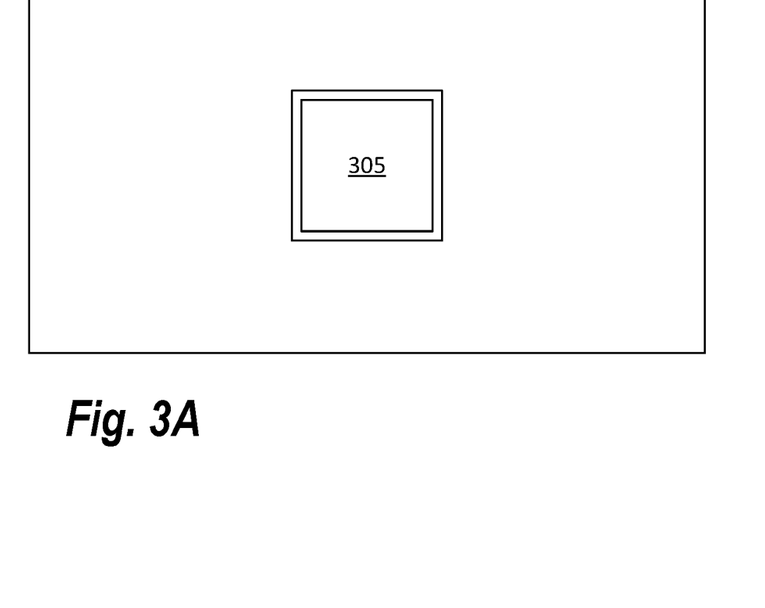
FIG. 3A provides an overview of a Capacitive Sensor, according to some embodiments.
Figure 3B:
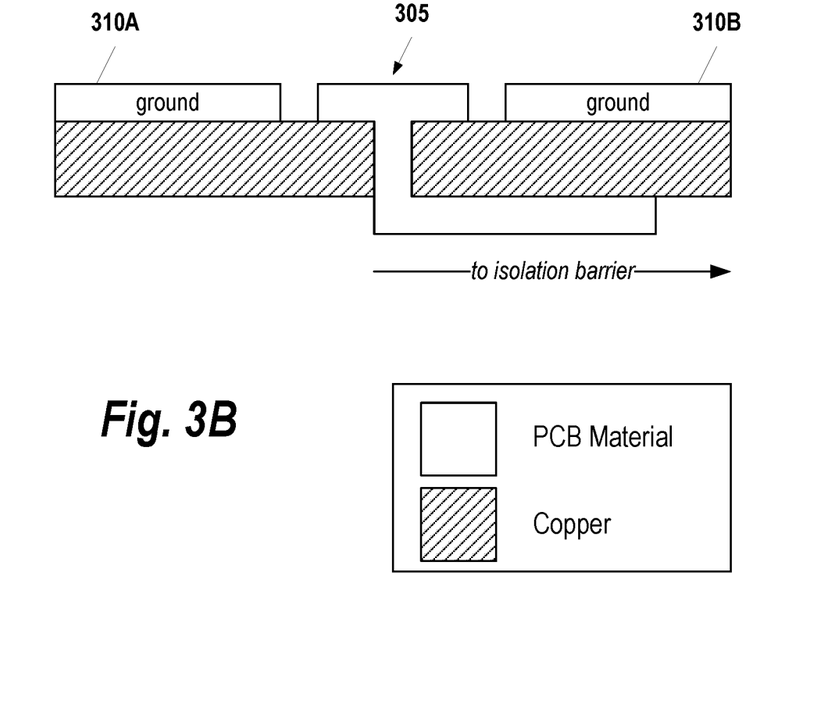
FIG. 3B provides an alternative view of the Capacitive Sensor, according to some embodiments.
Figure 3C:
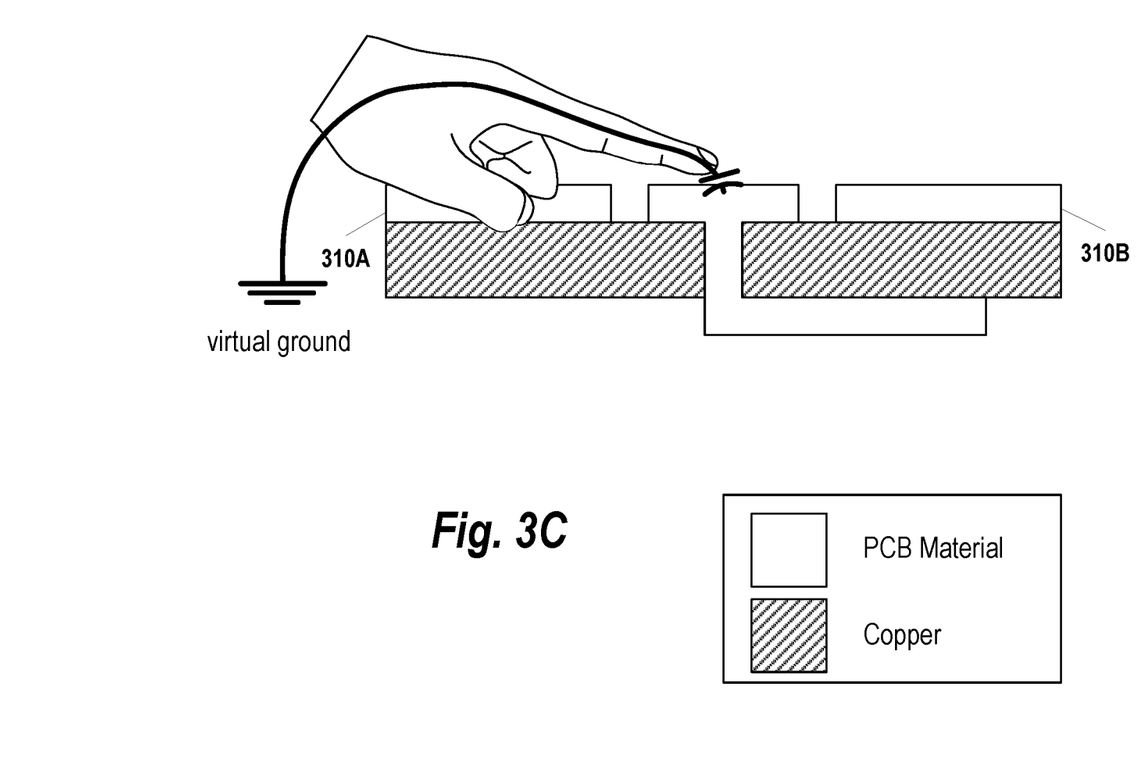
FIG. 3C shows how the Capacitive Sensor can be implemented with a human's finger used as a conductor, according to some embodiments.
Figure 3D:
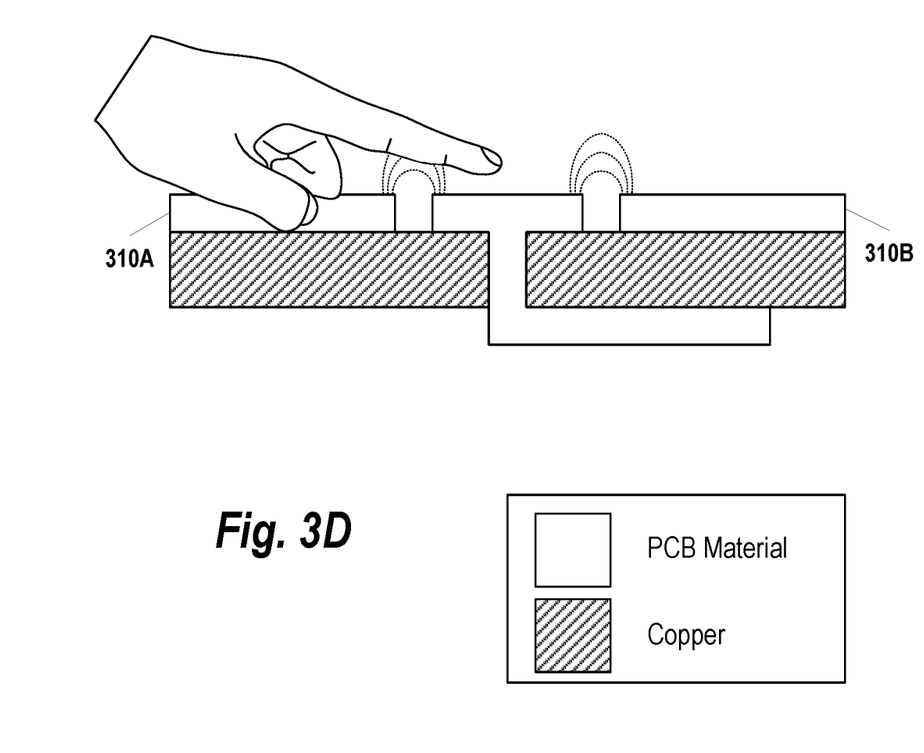
FIG. 3D shows how the Capacitive Sensor can be implemented with a human's finger used as dielectric, according to some embodiments.

FIGS. 3A-3D show various examples of the Capacitive Sensor 225 which can be implemented. For example, in some embodiments, Capacitive Sensor 225 operates similar to how a conventional touch screen operates. FIG. 3A shows an overhead view of the Capacitive Sensor 225 with a touch plate 305 located at the center. As shown in FIG. 3B, there are two ground plates 310A, 310B on opposite sides of the touch plate 305. Each plate is made of a printed circuit board (PCB) connected over copper sections. Using this configuration, FIG. 3C shows how a human's finger can be used as a conductor. FIG. 3D shows how the human's finger can be used as dielectric; thus, if the Capacitive Sensor 225 is sensitive enough, an actual touch of the sensor would not be necessary.

Returning to FIG. 2, the carrier wave associated with the generated signal is received across the patient isolation barrier and is used as input to the Capacitive Sensor 225. Once the Patient 230 touches the Capacitive Sensor 225, the resultant capacitance change will start to affect the signal.

Figure 4:
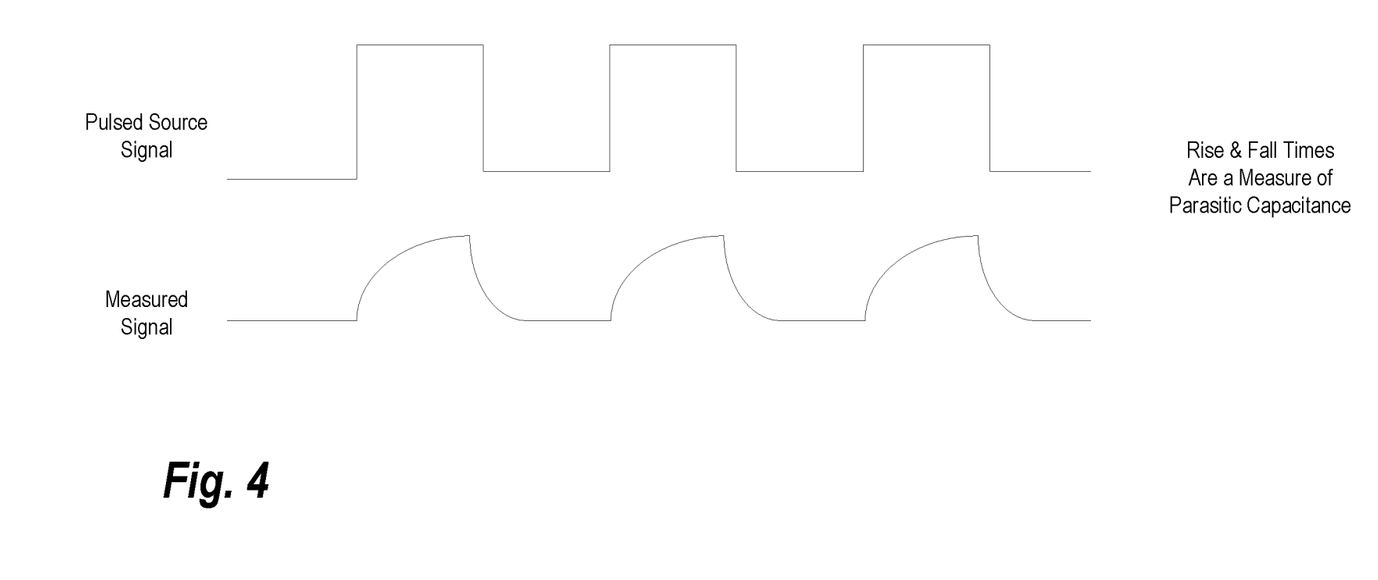
FIG. 4 shows an example of how the rise and fall times of a pulsed source signal (top) can be affected by parasitic capacitance and result in changes to a measured signal (bottom)

For example, FIG. 4 illustrates how the rise and fall times of a pulsed source signal (top) can be affected by parasitic capacitance and result in changes to a measured signal (bottom). This rise and fall is proportional to the capacitance added to the Capacitive Sensor 225. This can be understood as essentially adding capacitors in parallel. If a sinusoidal signal is used (e.g., 1 MHz, 10 MHz), the entire AC signal passes over the patient isolation barrier and, as capacitance is added at the Capacitive Sensor 225, the resulting waveform will shrink.

An Analog to Digital Converter (ADC) 235 on the Signal Side converts the signal generated at the Capacitive Sensor 225 to digital and provides the converted signal to the Microprocessor 240. The Microprocessor 240 measures parasitic capacitance based on the received signal and calculates the potential for deadly leakage currents. In some embodiments, the Microprocessor 240 actively monitors the signal for deviations into order to identify one or more alert conditions. For example, the Microprocessor 240 may indicate that the Patient 230 (or other individual) touched something he or she should not have touched. Alternatively, the Microprocessor 240 may identify one or more pieces of equipment that were incorrectly connected, or were connected in a manner that overly degrades system performance. In some embodiments, a predetermined threshold is set to such that deviations exceeding the threshold trigger the Microprocessor 240 to execute one or more remedial actions (see FIG. 5). This threshold may be set based, for example, on the known characteristics of the electrical signal generated by the Frequency Injection Circuit 245 and the anticipated configuration of the system (e.g., the number of devices to be connected to the system and their respective characteristics). It should be noted that sampling of the signal can be performed on either side of the patient isolation barrier. Thus, in other embodiments, the ADC 235 and Microprocessor 240 may be located on the Isolated Side of the patient isolation barrier.

The various components shown on the Signal Side of FIG. 2 can, in general, be integrated with any electrical device. Thus, within the medical diagnostics domain, the components can be embodied into a specialized device that connects one or more medical devices. For example, the components can be used in a custom ground fault circuit interrupter (GFCI). If a person touches the jacket of cable, the Microprocessor 240 in the GFCI could smartly turn off mains before any potential hazard occurs. Alternatively, the components shown on the Signal Side of FIG. 2 can be integrated into one or more medical devices. Moreover, although FIG. 2 shows how the components may react to capacitance changes that result from the Patient 230 touching the Capacitive Sensor 225, in general any changes in capacitance may trigger the various alert mechanisms of the Microprocessor 240. For example, if one or more devices are connected that cause a significant capacitance change, the alert mechanisms can be similarly triggered.

Figure 5:
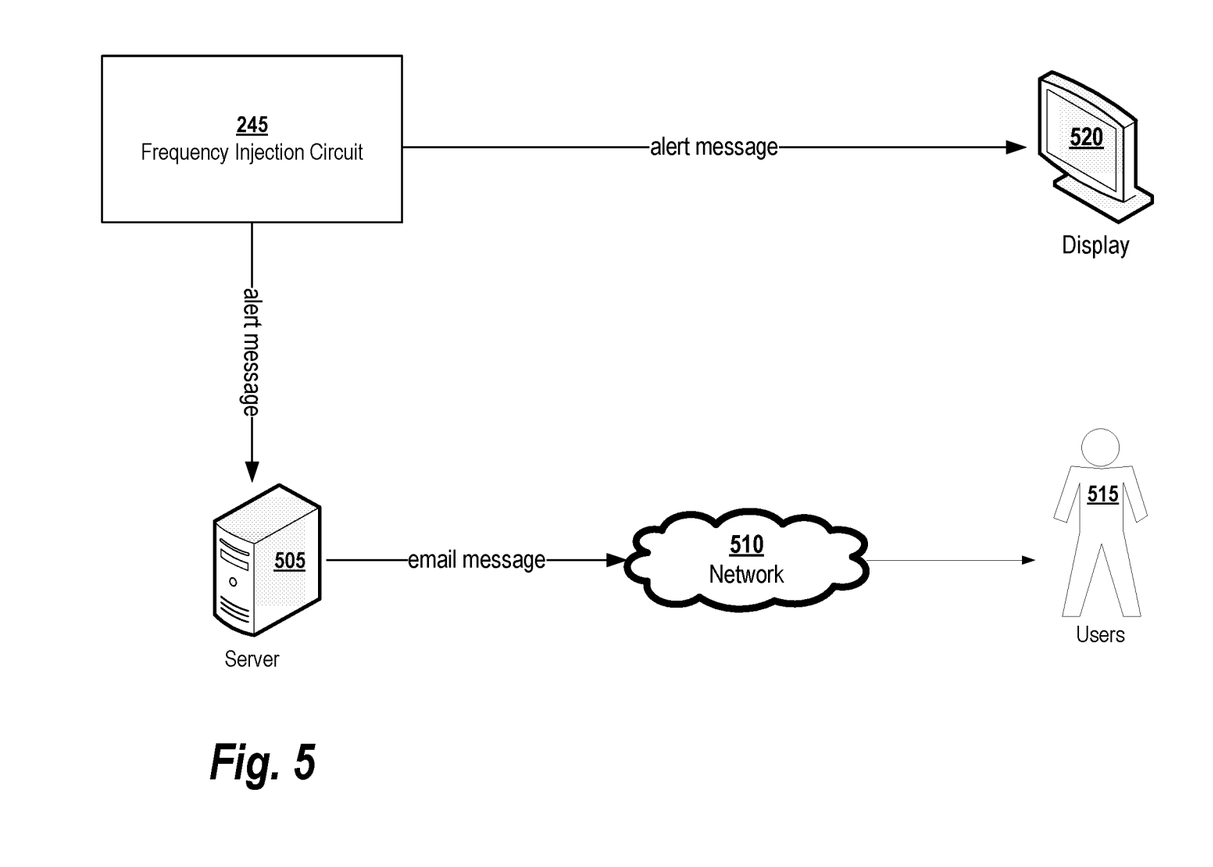
FIG. 5 illustrates an example of the remedial actions that can be performed when a Frequency Injection Circuit detects deviations in the sense signal transmitted across the isolation barrier.

FIG. 5 illustrates an example of the remedial actions that can be performed when the Frequency Injection Circuit 245 detects deviations in the sense signal transmitted across the isolation barrier. In this example, two actions are performed. First, the alert message is transmitted to a Server Computer 505 that formats the alert into an email message that, in turn, is transmitted over a Network 510 to one or more Users 515. The alert message may be transmitted between the Frequency Injection Circuit 245 and the Server Computer 505 using any format generally known in the art. For example, in one embodiment, the alert message is transmitted in Extensible Markup Language (XML) and the Server Computer 505 includes software that enables it to extract the relevant information from the XML and format it into an email message. As a second example, the Frequency Injection Circuit 245 transmits instructions for displaying the alert message to a Display 520. As an alternative to displaying the alert message on a computer monitor, in some embodiments, a different visual mechanism may be used (e.g., flashing light). Other, non-visual alert mechanisms may be used as well (e.g., buzzers or other auditory alarms).

It should also be noted that the systems and techniques described herein are not limited to the medical domain. Rather, the principles can generally be applied in any environment where electrical devices are separated from humans (or other systems) by an isolation barrier.

The functions and process steps herein may be performed automatically, wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112(f), unless the element is expressly recited using the phrase "means for."

I claim:

1. A system for monitoring electrical current leakage on one or more medical devices, the system comprises:
    an isolation barrier comprising a capacitor;
    a frequency injection circuit located on a first side of the isolation barrier, wherein the frequency injection circuit comprises,
        (a) an electronic oscillator generating an electrical signal,
        (b) a resistor providing the electrical signal to a first side of the capacitor and a first input of an analog to digital converter (ADC), and
        (c) a buffer coupling the electrical oscillator and the resistor;
    the one or more medical devices located on a second side of the isolation barrier and comprising a capacitive sensor, wherein the capacitive sensor is connected to a second side of the capacitor and wherein a node between the capacitive sensor and the capacitor is coupled to a second input of the ADC;
    a microprocessor, coupled to an output of the ADC, configured to:
    measure capacitance of the isolation barrier by sampling the electrical signal, provided to the first and second inputs of the ADC,
    if the capacitance exceeds a pre-determined threshold, generate one or more alert messages indicating electrical current leakage, and disable mains electricity powering the at least one of the one or more medical devices.

2. The system of claim 1, wherein the electronic oscillator is a sine wave oscillator.

3. The system of claim 1, wherein the electronic oscillator produces a pulsating direct current signal.

4. The system of claim 1, wherein the microprocessor is connected to the frequency injection circuit on the first side of the isolation barrier.

5. The system of claim 1, wherein the microprocessor is connected to at least one of the medical devices on the second side of the isolation barrier.

6. The system of claim 1, wherein the capacitive sensor comprises a touch plate and the electrical signal is changed when a grounded person touches the touch plate.

7. The system of claim 1, further comprising:
a server computer configured to transmit the one or more alert messages to one or more users over a computer network.

8. A method for monitoring electrical current leakage on one or more medical devices, the method comprises:
generating an electrical signal using a frequency injection circuit located on a first side of a isolation barrier comprising a capacitor, wherein the frequency injection circuit comprises:
(a) an electronic oscillator generating an electrical signal,
(b) a resistor providing the electrical signal to a first side of the capacitor and a first input of an analog to digital converter (ADC), and
(c) a buffer coupling the electrical oscillator and the resistor;
receiving the electrical signal by the one or more medical devices,
wherein the medical devices are located on a second side of the isolation barrier and comprise a capacitive sensor, and
wherein a node between the capacitive sensor and the capacitor is coupled to a second input of the ADC;
continuously sampling, by a microprocessor, the electrical signal provided to the first and second inputs of the ADC to measure capacitance of the isolation barrier;
if the capacitance exceeds a pre-determined threshold, executing, by the microprocessor, one or more remedial actions, wherein the one or more remedial actions comprise generating an alert message indicating electrical current leakage and disabling mains electricity powering the medical devices.

9. The method of claim 8, wherein the electrical signal is sampled by the microprocessor on the first side of the isolation barrier.

10. The method of claim 8, wherein the electrical signal is sampled by the microprocessor on the second side of the isolation barrier.

11. The method of claim 8, further comprising:
transmitting an email with the alert message to one or more users.

12. The method of claim 8, further comprising:
presenting the alert message a display.

13. A method for monitoring electrical current leakage on one or more medical devices, the method comprises:
generating an electrical signal using a frequency injection circuit located on a first side of a isolation barrier comprising a capacitor, wherein the frequency injection circuit comprises:
(a) an electronic oscillator generating an electrical signal,
(b) a resistor providing the electrical signal to a first side of the capacitor and a first input of an analog to digital converter (ADC), and
(c) a buffer coupling the electrical oscillator and the resistor;
receiving the electrical signal by the one or more medical devices,
wherein the medical devices are located on a second side of the isolation barrier and comprise a capacitive sensor, and
wherein a node between the capacitive sensor and the capacitor is coupled to a second input of the ADC;
continuously sampling, by a microprocessor, the electrical signal provided to the first and second inputs of the ADC to identify deviations in the sampled electrical signal exceeding a predetermined threshold caused by activation of the capacitive sensor
executing, by the microprocessor, one or more remedial actions based on the identified deviations in the electrical signal, wherein the one or more remedial actions comprise generating one or more alert messages indicating electrical current leakage and disabling mains electricity powering the medical devices.

* * * * *